United States Patent [19]

Nagayama et al.

[11] Patent Number: 4,985,641

[45] Date of Patent: Jan. 15, 1991

[54] SEMICONDUCTOR INTEGRATED CIRCUIT DEVICE HAVING SELECTABLE OPERATIONAL FUNCTIONS

[75] Inventors: Yasuji Nagayama, Hirayama; Kazutoshi; Atsushi Ozaki, all of Hyogo, Japan

[73] Assignee: Mitsubishi Denki Kabushiki Kaisha, Tokyo, Japan

[21] Appl. No.: 315,084

[22] Filed: Feb. 24, 1989

[30] Foreign Application Priority Data

May 7, 1988 [JP] Japan .................... 63-110814

[51] Int. Cl.$^5$ .................... H03K 17/22; H03K 17/284; H03K 5/153; H03K 17/687
[52] U.S. Cl. .................... 307/272.3; 307/594; 307/597; 307/362
[58] Field of Search .................... 307/272.3, 592, 594, 307/597, 279, 296.4, 296.5, 603, 362

[56] References Cited

U.S. PATENT DOCUMENTS

| | | | |
|---|---|---|---|
| 4,558,233 | 12/1985 | Nakamori | 307/594 X |
| 4,581,552 | 4/1986 | Womack et al. | 307/594 X |
| 4,591,745 | 5/1986 | Shen | 307/594 X |
| 4,631,420 | 12/1986 | Hollis et al. | 307/272.1 |
| 4,677,321 | 6/1987 | Bacrania | 307/594 X |
| 4,698,529 | 10/1987 | Asami | 307/542 |
| 4,716,322 | 12/1987 | D'Arrigo et al. | 307/594 X |
| 4,716,323 | 12/1987 | Wada et al. | 307/594 |
| 4,812,679 | 3/1989 | Mahabadi | 307/594 X |
| 4,818,904 | 4/1989 | Kobayashi | 307/594 |
| 4,877,980 | 10/1989 | Kubinec | 307/594 X |
| 4,885,476 | 12/1989 | Mahabadi | 307/594 X |
| 4,922,122 | 5/1990 | Dubujet | 307/272.1 X |

FOREIGN PATENT DOCUMENTS

3218992A1 11/1983 Fed. Rep. of Germany .
3712178A1 10/1987 Fed. Rep. of Germany .
1197317 7/1970 United Kingdom .

OTHER PUBLICATIONS

Koichiro Mashiki et al., "A 70 ns 256K DRAM with Bit-Line Shield" IEEE Journal of Solid State Circuits, vol. SC-19, No. 5, Oct. 1984, pp. 591-593.
West, "The CMOS Key to Portable Electronics", *New Scientist*, vol. 5, Jun. 1975, pp. 550-552.

*Primary Examiner*—Stanley D. Miller
*Assistant Examiner*—David R. Bertelson
*Attorney, Agent, or Firm*—Lowe, Price, LeBlanc, Becker & Shur

[57] ABSTRACT

A semiconductor integrated circuit device for setting operational functions dependent on connection of a first bonding pad (20) to a power supply includes switching transistors (Q11, Q40, Q52, Q32) for resetting an input signal line (30) connected to the first bonding pad to a predetermined potential when there is no power supply potential applied to the first bonding pad immediately after turn-on of an operation power supply, at least one inverter (Q3, Q4, Q13, Q14; Q42, Q43; Q50, Q51) responsive to the turn-on of the power supply for the device, for setting and maintaining the potential on the input signal line, and switching transistors (Q12; Q32; Q41; Q52) to be turned on in response to output of the inverter, for cutting off a current path from the power supply through the bonding pad to the input signal line.

14 Claims, 9 Drawing Sheets

Vcc

POR

φ

FIG. 2
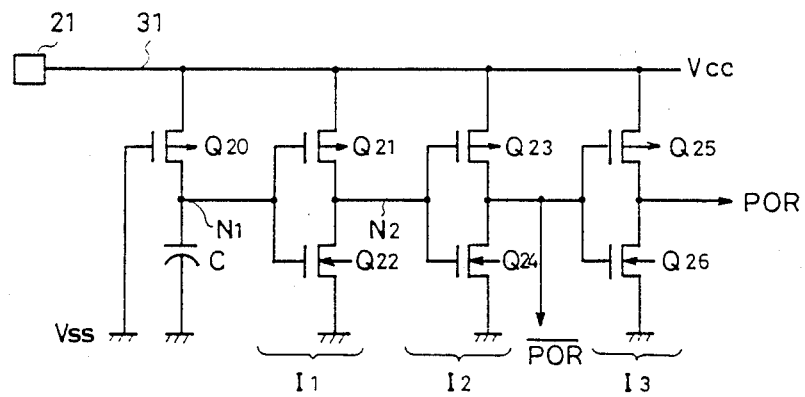
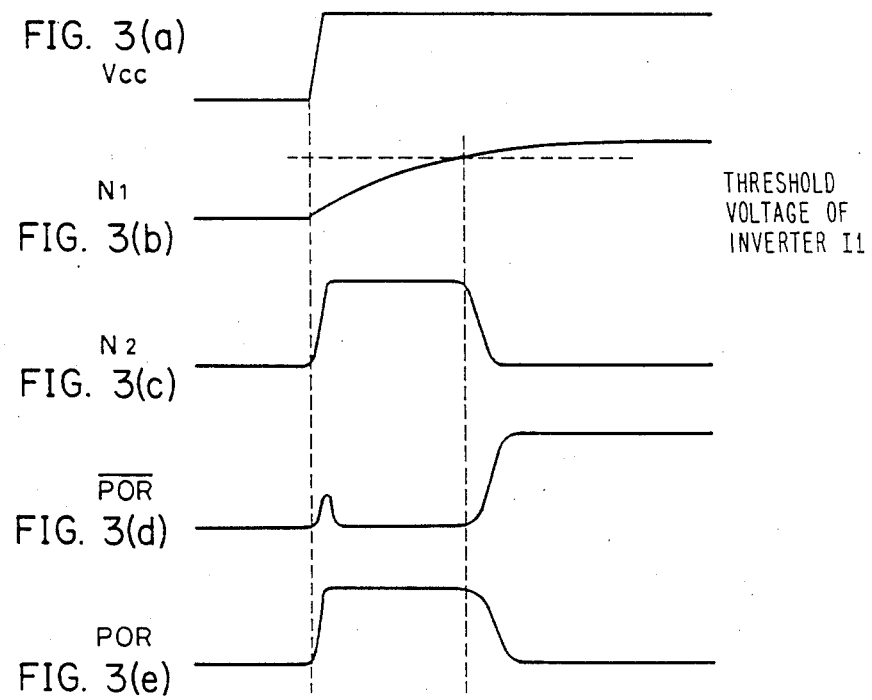

FIG.6
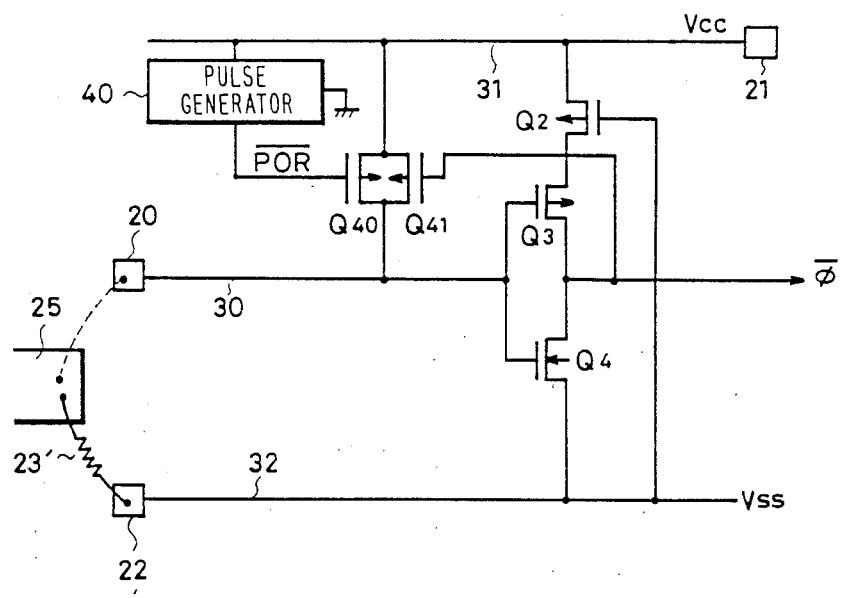
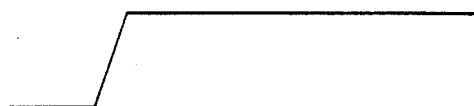
FIG. 7(a) Vcc
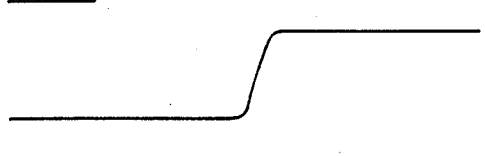
$\overline{POR}$
FIG. 7(b)
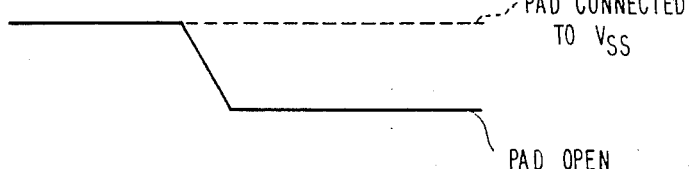
$\overline{\phi}$
FIG. 7(c)

FIG. 13
PRIOR ART
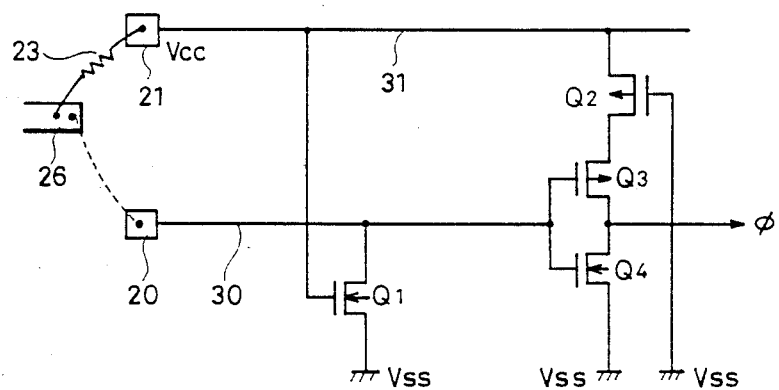
PRIOR ART
FIG. 14(a) Vcc
FIG. 14(b) φ
FIG. 15(a) Vcc
FIG. 15(b) φ

FIG.16 PRIOR ART
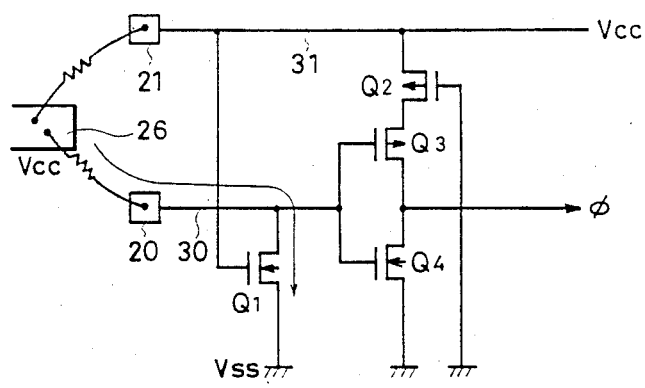
FIG.17 PRIOR ART
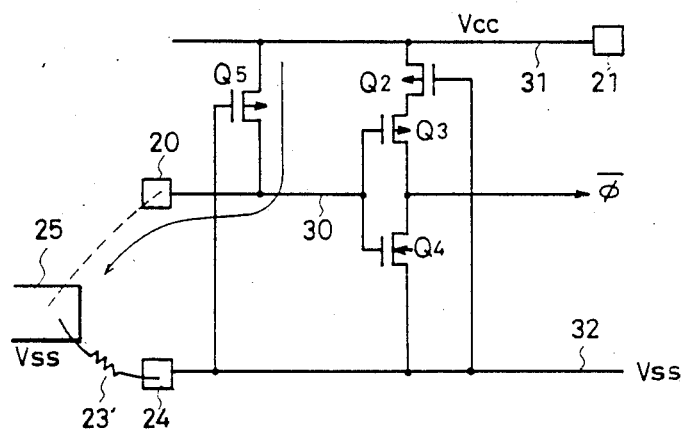
PRIOR ART
FIG. 18(a)
FIG. 18(b)
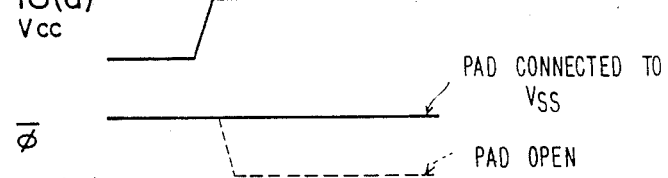

SEMICONDUCTOR INTEGRATED CIRCUIT DEVICE HAVING SELECTABLE OPERATIONAL FUNCTIONS

BACKGROUND OF THE INVENTION

1. Field of the Invention

The present invention relates to semiconductor integrated circuit devices and particularly to a circuit configuration for generating a signal for designating an operational function of a semiconductor integrated circuit device.

2. Description of the Background Art

Recent developments in electronic techniques have accomplished various functions with semiconductor integrated circuits. From the viewpoint of improvement of productivity, it is desirable to form integrated circuits on respective chips with the same chip design and to select (or set) desired ones of various functions by setting connections by a master slicing technique or by changing connections between pads on a chip and the pin terminals of a package at the time of wire bonding. If many functions can be accomplished by such selection technique, circuit design which was made for each function in the prior art can be made simultaneously for a plurality of functions and this is desirable from the viewpoint of improvement of design efficiency. Therefore, efforts have been made to accomplish multiple functions by using a selection technique. The master slicing technique is the one in which after transistors and common connection portions have been formed on respective chips, only connection portions different for respective functions are formed by using different masks. The bonding wire selection technique is the one in which circuit configurations on respective chips are the same and connection between pads on a chip and pin terminals of a package is changed for each function at the time of wire bonding for mounting the chip.

Particularly, in recent years, there is a tendency that slightly different functions are required for dynamic RAMs (DRAMs), static RAMs or the like. Accordingly, the techniques such as the master slicing or the wire bonding selection for accomplishing required functions are frequently utilized, thereby to improve efficiency in manufacturing of a product.

FIG. 11 shows an example of a configuration of a semiconductor integrated circuit in which selection of functions is made by such a wire bonding selection technique. In FIG. 11, a memory device such as a RAM is shown as an example. Referring to FIG. 11, pads 3a, 3b, 3c, 3d and 3e as connection terminals for communicating signals with an external portion to the chip and for supplying power supply potentials are provided on peripheral portions of a semiconductor chip 1. The pad 3a is connected to a lead 4 of a package through a bonding wire 5. The pad 3c for setting a function of the semiconductor memory is connected to a function instructing signal generating circuit 6 so that a function instructing signal from the function instructing signal generating circuit 6 is supplied to a memory portion 7. More specifically, the function instructing signal generating circuit 6 generates signals of predetermined levels, each of which depends on whether the pad 3c is connected to the lead terminal 4 or not, whereby the function of the memory 7 is set as desired. In addition, if the pad 3a for example is formed as the connection portion for supplying an operation power supply potential in the pad arrangement of a normal chip in the construction shown in FIG. 11, the pad 3b for supplying a ground potential Vss for example is generally located at a position opposed to the pad 3a.

FIG. 12 shows a concrete example of a construction for generating a function instructing signal by selection of bonding to the pads at the time of wire bonding as described above. In the construction shown in FIG. 12, it is possible to realize a DRAM having either a page mode or a nibble mode dependent on selection of bonding of pads.

Referring to FIG. 12, there are provided a pad 10 for receiving an externally applied signal Ext. $\overline{RAS}$, and a buffer 13 for generating an internal timing signal INT. RAS upon receipt of the signal Ext. $\overline{RAS}$ supplied from the pad 10, which constitute a path for generating operation timing of row selection such as receiving and decoding a row address in the DRAM.

A path for generating a signal for controlling operation of column selection to apply timing for receiving a column address and decoding a column in the DRAM comprises a pad 11 for receiving an externally applied signal Ext. $\overline{CAS}$, and a buffer 14 connected to the pad 11, for generating an internal timing signal INT. CAS upon receipt of the signal Ext. $\overline{CAS}$.

A path for setting an operation mode of the DRAM comprises a pad 12 provided for setting a function, a mode designation signal generating circuit 16 for generating a mode designation signal of a level dependent on the potential of the pad 12, and a buffer 15 activated in response to the internal signal INT. CAS from the buffer 14 and generating a nibble enable signal in response to a signal level from the mode designation signal generating circuit 16.

In the construction shown in FIG. 12, a signal for setting the nibble mode is generated when the page/nibble setting pad 12 is connected to the power supply potential, and a page enable signal is generated when the pad 12 is not connected to any portion, that is, in an open state, so that a page function is given to the DRAM. Thus, switching between the page mode function and the nibble mode function is made dependent on connection of the pad 12. Accordingly, the construction of the internal circuit of the DRAM is unchanged, which makes it possible to improve efficiency in circuit design and productivity.

FIG. 13 shows a concrete construction example of the mode designation signal generating circuit shown in FIG. 12. In the construction of FIG. 13, function setting is effected dependent on connection between a function designation pad 21 and a power supply potential Vcc. Referring to FIG. 13, the mode designation signal generating circuit comprises an n channel MOS (insulated gate) transistor Q1 for setting and maintaining a potential of an input signal line 30 connected to a mode designation pad 20, and an inverter including transistors Q2, Q3, and Q4 for inverting the signal potential on the input signal line 30 and outputting the inverted potential.

The transistor Q1 has one conduction terminal connected to the input signal line 30, its gate connected to a power potential Vcc supply line 31, and the other conduction terminal connected to the potential Vss as the ground potential for example.

The inverter comprises: the p channel MOS transistor Q2 having one conduction terminal connected to the power supply line 31 and its gate connected to the potential Vss; the p channel MOS transistor Q3 having one conduction terminal connected to the other conduction terminal of the transistor Q2 and its gate connected to the input signal line 30; and the n channel MOS transistor Q4 having one conduction terminal connected to the other conduction terminal of the transistor Q3, its gate connected to the input signal line 30 and its other conduction terminal connected to the potential Vss. The mode designation signal $\phi$ is provided from a connection node of the transistors Q3 and Q4. The power supply line 31 is connected to the power supply pad 21. The pad 21 is connected to a power supply terminal 26 through a bonding wire 23. The terminal 26 corresponds to a lead terminal of a package and supplies the power potential Vcc.

First, operation in the case of the pad 20 in the open state will be described with reference to FIG. 14 showing an operation waveform diagram in the pad open state. When a system power supply is turned on, the potential on the power supply line 31 to which the power potential Vcc is applied rises. In response thereto, the n channel MOS transistor Q1 is in the on state and the potential on the input signal line 30 is set and maintained at the potential Vss. The inverter comprising the transistors Q2 to Q4 inverts and outputs a signal of a low (L) level (the Vss level) on the input signal line 30. Accordingly the mode designation signal $\phi$ is supplied which rises after an elapse of a delay time in the inverter after the power supply potential Vcc has been applied. In response to a high (H) level of this signal $\phi$, an operation mode of the DRAM for example is set.

Next, operation in the case of the pad 20 being connected with the power supply terminal 26 as shown by the broken line in FIG. 13 will be described with reference to FIG. 15 showing an operation waveform diagram in the connected state of the pad. When the power supply is turned on to apply the power supply potential Vcc, the potentials on the power supply line 31 and the input signal line 30 rise. In response to the turn-on of the power supply, the input signal line 30 is charged up to the level Vcc and then the output signal $\phi$ from the inverter is fixed to the L level potential. The reason why the input signal line 30 is charged up to the level Vcc is that the power from the power supply terminal 26 is supplied in a by far larger extent than the discharging capability of the transistor Q1. If the pad 20 is connected with the power supply terminal 26 in this construction, current flows through a path connecting the power supply Vcc of the terminal 26, the bonding wire, the pad 20, the input signal line 30, the transistor Q1 and the potential Vss. In order to suppress this current, a transistor having a transistor length (gate length) as long as possible and a high impedance (namely, a high on resistance) is used as the transistor Q1.

Thus, the pad used only for selecting functions is provided and wired to be in the open state or at the power supply potential Vcc, thereby to set a function selecting output signal level to the H or L level, and accordingly it is possible to control the level of a signal from a control signal generating circuit in the chip and to select a desired function.

As described above, the function designation signal $\phi$ for setting a desired function can be generated dependent on the connection state of the pad 20. However, if the mode designation signal generating circuit as shown in FIG. 13 is used, it is necessary to connect the pad 20 to the power supply potential Vcc in order to set the signal $\phi$ to L level. In this case, there exists a path for direct current from the power supply potential Vcc to a potential Vss as the ground potential for example through the transistor Q1. Although the impedance of the transistor Q1 is set to as high a value as possible to minimize the value of that current, it is difficult to realize a DRAM or other functional device with an ultra-low standby current due to consumed current in that path because there is a current flowing in the transistor Q1.

In addition, as shown in FIG. 17, there is a case of providing a function designation signal of a polarity opposite to that in the construction shown in FIGS. 13 and 16. In the construction shown in FIG. 17, a control signal $\overline{\phi}$ is provided dependent on whether the pad for function designation is connected with the ground potential Vss or not, and the polarity of this signal $\phi$ is just opposite to that in FIG. 13. More specifically, in the construction shown in FIG. 17, a p channel MOS transistor Q5 is provided between the Vcc supply line 31 and the input signal line 30, and the gate of the transistor Q5 is connected to the ground potential Vss. In this case, if the pad 20 for function designation is in the open state, the input signal line 30 is charged to H level by the power from the power supply line 31 through the transistor Q5 in the on state. As a result, the level of the signal $\phi$ outputted from the inverter becomes L level (shown by the broken line in FIG. 18). On the other hand, if the pad 20 is connected to the Vss ground potential terminal 25, the input signal line 30 is discharged down to L level from the pad 20 through the ground terminal 25. In response to the change of the potential of the input signal line 30, the output of the inverter becomes H level (shown by the solid line in FIG. 18). In this case also, the level of the control signal $\overline{\phi}$ changes dependent on wiring of the pad 20 and it becomes possible to select a desired function. However, also in the construction shown in FIG. 17, if the pad 20 is connected with the ground terminal 25, there exists a path where direct current flows from the power supply line 31 through the transistor Q5, the input signal line 30, the pad 20 and the ground terminal 25. Thus, current flows in that path when the pad 20 is connected. Although the transistor Q5 has a transistor length (gate length) as large as possible to increase impedance in the same manner as in the construction of FIG. 13 in order to minimize the value of that current, it is still difficult to entirely cut off the current, and direct current flows in the path.

As described above, in the conventional function selecting technique by wiring bonding, if the pad is connected with the power supply terminal or the ground terminal, the path of direct current from the power supply potential Vcc to the ground potential Vss through the transistor for setting and maintaining the potential of the input signal line exists and accordingly it is difficult to realize a DRAM or other functional device with ultra-low standby current.

Although the transistor length (gate length) of the transistor Q1 or Q5 may be increased to minimize the amount of the current flow flowing when connection to the pad is provided, as described above, there is involved a disadvantage in such a case that the area occupied by the transistor is increased and the direct current flowing through the transistor cannot be reduced to a ultra-low standby current of less than $10\mu$ A in such a system.

In addition, since the transistor Q1 functions to maintain the potential of the input signal line 30 to a stable ground potential when the pad 20 is in the open state, the MOS transistor Q1 cannot be omitted only for the purpose of cutting off a direct current component caused by connection of the pad. Similarly, the transistor Q5 cannot be removed from the construction since it functions to maintain the potential of the input signal line to a stable power supply potential Vcc when the pad 20 is in the open state.

In addition, in a normal semiconductor device, the terminal of the power supply potential Vcc and the terminal of the ground potential Vss are located at opposite positions as in the case of the pads 3a and 3b in the construction shown in FIG. 11 for example and it is necessary to provide a pad for function designation near either terminal (for the purpose of facilitating wire bonding). Accordingly, it is not possible to adopt a construction from which the transistor Q1 or Q5 is removed by connecting the pad 20 to the terminal of the power supply potential Vcc or the terminal of the ground potential Vss.

Thus, the above described construction using the conventional wire bonding selection system or the like for generating the internal operation mode instructing signal dependent on connection of the input signal line to the power supply potential or the ground potential involves the disadvantage that the direct current path exists through the connection of the pad, making it difficult to realize a device having low current consumption.

The construction for setting a function of a device dependent on connection with a pad as described above is disclosed for example in "A 70 ns 256K DRAM with Bit-Line Shield", IEEE Journal of Solid-State Circuits Vol. SC-19, No. 5, 1984, pp. 591 to 592.

SUMMARY OF THE INVENTION

An object of the present invention is to provide a semiconductor integrated circuit device having ultra-low standby current characteristics and being capable of selecting functions by switching of connection of an input signal line, by which the above described disadvantages of the conventional semiconductor circuit device have been overcome.

A semiconductor integrated circuit device according to the present invention comprises means for setting and maintaining a potential of an input signal line, and means responsive to application of an operation power supply potential for cutting off a current path from the operation power supply potential to a second potential, e.g. a ground potential through the input signal line.

More specifically, a first semiconductor integrated circuit device according to the present invention comprises means for setting and maintaining a potential of an input signal line, provided between the input signal line and a second power supply line for supplying a second potential different from a potential of an operation power supply, and means responsive to application of the operation power supply potential to a first power supply line supplying the operation power supply potential, for cutting off a current path between the input signal line and the second power supply line.

A second semiconductor integrated circuit device according to the present invention comprises means for setting and maintaining a potential of an input signal line, provided between a first power supply line and the input signal line, and means responsive to application of an operation power supply potential to the first power supply line, for cutting off a current between the first power supply line and the input signal line.

In the semiconductor integrated circuit device according to the present invention, the means responsive to the application of the operation power supply potential to the first power supply line, for cutting off the current path between the input signal line and the first or second power supply line is provided and accordingly a direct current component can be cut off even if the input signal line is connected to the potential of either power supply, making it possible to realize ultra-low standby current characteristics.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram showing a concrete construction example of a pulse signal generating circuit for resetting an input signal line for use in the present invention.

FIG. 3 is a waveform diagram showing operation of the pulse signal generating circuit shown in FIG. 2.

FIG. 6 is a diagram showing a construction of a semiconductor integrated circuit device according to a fourth embodiment of the invention.

FIG. 7 is a waveform diagram showing operation of the semiconductor integrated circuit device shown in FIG. 6.

FIG. 13 is a diagram showing an example of a construction of a conventional semiconductor integrated circuit device.

FIGS. 14 and 15 are waveform diagrams showing operation of the conventional semiconductor integrated circuit device shown in FIG. 13. Particularly, FIG. 14 shows an operation waveform diagram in the case of an input signal line being in an open state and FIG. 15 shows an operation waveform diagram in the case of an input pad (input signal line) being connected to a power supply potential Vcc.

FIG. 16 is a diagram for explaining the problems of the conventional semiconductor integrated device of FIG. 13.

FIG. 17 is a diagram for explaining the problems of another conventional semiconductor integrated circuit device.

FIG. 18 is a waveform diagram showing operation of the conventional semiconductor integrated circuit device shown in FIG. 17.

DESCRIPTION OF THE PREFERRED EMBODIMENTS

Figure 1A:
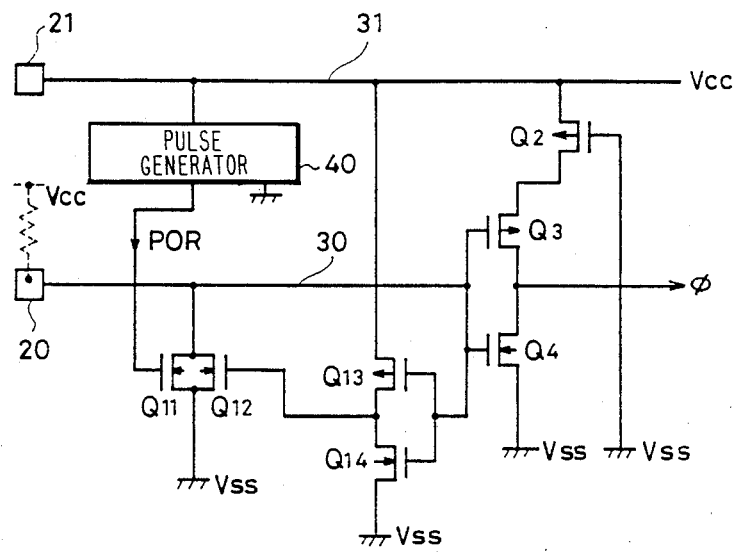
FIG. 1 A is a diagram showing an example of a construction of a semiconductor integrated circuit device according to an embodiment of the present invention.
FIG. 1B is a waveform diagram showing operation of the semiconductor integrated circuit device shown in FIG. 1A.

FIG. 1A is a diagram showing an example of a construction of a semiconductor integrated circuit device according to an embodiment of the invention.

Referring to FIG. 1A, in order to reset an input signal line, there are provided a pulse generator 40 responsive to application of a power supply potential Vcc to a power supply line 31 for providing a one-shot pulse signal POR having a predetermined pulse width, and an n channel MOS transistor Q11 to be turned on in response to the pulse signal POR from the pulse generator 40 for resetting an input signal line 30 to a ground potential Vss.

In order to set and maintain a potential on the input signal line 30 and to cut off a current path (a path for a direct current component), there are provided a CMOS inverter for inverting the potential on the input signal line 30 and outputting the same, and an n channel MOS transistor Q12 for maintaining the potential on the input signal line 30 and cutting off the current path. The CMOS inverter has a complementary connection structure of a p channel MOS transistor Q13 and an n channel MOS transistor Q14, provided between the power supply line 31 and the second potential Vss, having their input gates connected to the input signal line 30 and their output gates connected to the gate of the transistor Q12. In order to generate a function instructing signal $\phi$ according to the potential on the input signal line 30, another CMOS inverter is provided, in the same manner as in the prior art, which comprises p channel MOS transistors Q2 and Q3 and an n channel MOS transistor Q4. The transistor Q11 is turned on immediately after turn-on of the power supply in response to the pulse signal POR from the pulse generator 40, thereby to reset the input signal line 30. If the pad 20 is connected to the power supply potential Vcc, a rush current caused by the application of voltage from the power supply potential to the ground potential Vss flows through the on-state transistor Q11. In order to reduce the rush current, it is necessary to enhance impedance of the transistor Q11 and it is desirable to set the gate length thereof to a value as long as possible.

The threshold voltage of the CMOS inverter including the transistors Q13 and Q14 need to be set to a value enabling the potential of the input signal line to be fixed to a desired level immediately after the start of the resetting operation at the time of application of the power supply voltage. The setting of the threshold voltage of the inverter can be effected by adjusting a ratio of capabilities of the transistors Q13 and Q14 (that is, a ratio of on resistances or a ratio of threshold voltages based on the sizes of the transistors).

Figure 1B:
Figure 1C:
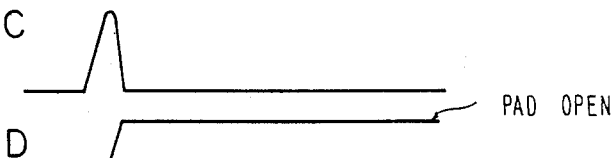
Figure 1D:

Now, operation will be described. First, operation in the case of the pad 20 in the open state will be described. When the power supply potential Vcc is applied to the power supply line 31 through the power supply pad 21, a one-shot pulse signal POR is responsively generated from the pulse generator 40 to be supplied to the gate of the MOS transistor Q11. In response thereto, the input signal line 30 is reset to the ground potential Vss through the transistor Q11 in the on state so that it is held stably at the ground potential. At the same time, when the input signal line 30 becomes lower in potential than the input threshold voltage of the CMOS inverter (including the transistors Q13 and Q14), a signal of H level is supplied to the gate of the transistor Q12 so that the transistor Q12 is turned on. Thus, the potential of the input signal line 30 is reset to the ground potential Vss by the transistor Q11 immediately after the turn-on of the power supply and it is fixed to the level of the ground potential Vss by maintaining the on state of the transistor Q12 when the power supply is turned on after the resetting of the transistor Q11. As a result, the level of an internal function instructing signal $\phi$ from the inverter including the transistors Q2, Q3 and Q4 becomes H (as shown in FIG. 1B).

Next, operation in the case of the pad 20 being connected to the power supply potential Vcc will be described. In this case, when the power supply potential Vcc is applied to the power supply line 31, the transistor Q11 is turned on in response to the signal POR. A direct current flowing path to the ground potential Vss through the power supply pad 20 is formed only when the transistor Q11 is in the on state. When the potential on the input signal line 30 rises to H level (a level exceeding the input threshold voltage of the inverter formed by the transistors Q13 and Q14) as the result of charging of the power supply potential Vcc from the pad 20, the output of the CMOS inverter formed by the transistors Q13 and Q14 falls to L level to turn off the transistor Q12. The transistor Q11 is also turned off at the fall of the signal POR and thus the direct current path is cut off. If the input threshold voltage of the CMOS inverter formed by the transistors Q13 and Q14 is set to turn off the transistor Q12 as soon as possible, a rush current at the time of application of the power supply voltage (namely, a current flowing from the input signal line 30 to the ground potential Vss) can be reduced because the impedance of the transistor Q11 is set to the highest allowable value. When the signal potential on the input signal line 30 rises to exceed the input threshold voltage of the inverter formed by the transistors Q2 to Q4, the output signal $\phi$ is fixed to L level (as shown in FIG. 1B). During the application of the power supply, the input signal line 30 is at H level in potential equal to the power supply potential Vcc since the power supply potential Vcc is applied thereto through the pad 20. At this time, the transistor Q11 is in the off state and the transistor Q12 is also in the off state set in response to the output of the inverter formed by the transistors Q13 and Q14. Accordingly, a current path from the input signal line 30 to the ground potential Vss does not exist and no consumption of current occurs.

In the above described construction, the level of the signal $\phi$ for designating a function in the device can be set to H or L level dependent on whether the pad 20 is connected to the power supply potential Vcc or not. In addition, if the pad 20 is connected to the power supply potential Vcc, it is possible to provide a circuit for generating a function designating signal with low power consumption since the direct current path is cut off.

FIG. 2 is a diagram showing an example of a construction of the reset signal generator shown in FIG. 1. In the construction shown in FIG. 2, the signal generating circuit comprises an RC delay circuit including a p channel MOS transistor Q20 and a capacitance C, for relaxing a rise of potential upon application of the power supply potential Vcc, and three stages of inverters receiving the output of the RC delay circuit.

In the RC delay circuit, the p channel MOS transistor Q20 has its one conduction terminal connected to the power supply lines 31, its gate connected to the ground potential Vss and its other conduction terminal connected to a node N1. The capacitance C is provided between the node N1 and the ground potential Vss.

The inverter I1 has a CMOS structure in which a p channel MOS transistor Q21 and an n channel MOS transistor Q22 are connected in a complementary manner.

The inverter I2 receiving the output of the inverter I1 has a structure in which a p channel MOS transistor Q23 and an n channel MOS transistor Q24 are connected in a complementary manner.

The inverter I3 receiving the output of the inverter I2 has a structure in which a p channel MOS transistor Q25 and an n channel MOS transistor Q26 are connected in a complementary manner. The pulse signal POR is provided from the inverter I3.

The p channel MOS transistor Q20 included in the RC delay circuit has an on resistance adjusted to a suitable value (determined according to the gate length), and the transistor Q20 and the capacitance C constitute the RC delay circuit. Next, operation of the pulse signal generating circuit shown in FIG. 2 will be described with reference to FIG. 3 showing an operation waveform diagram thereof.

First, when the power supply potential Vcc is applied to the power supply line 31, the node N1 is gradually charged through the transistor Q20 in the on state with a predetermined time constant. When the potential of the charged node N1 exceeds the threshold voltage of the inverter I1, the potential of the node N2 having risen to H level in response to the application of the power supply potential Vcc falls to L level. The signal $\overline{POR}$ outputted from the inverter I2 changes to L level because the potential of the node N2 soon exceeds the input threshold voltage of the inverter I2 although a smaller pulse signal was generated from the inverter I2 immediately after the application of the power supply potential. Then, the signal $\overline{POR}$ rises to H level when the output of the inverter I1 falls to L level. Since the initial small pulse signal of the signal $\overline{POR}$ does not exceed the input threshold voltage of the inverter I3, the output signal POR from the inverter I3 rises to H level in response to the turn-on of the power supply but it falls to L level in response to the change to H level of the output of the inverter I2. As a result, it becomes possible to generate the pulse signal POR having a desired pulse duration and rising in response to the turn-on of the power supply. The pulse duration of the signal POR can be regulated to an optimum value by suitably adjusting the time constant of the RC delay circuit and the input logic threshold voltage of each inverter stage.

Figure 4:
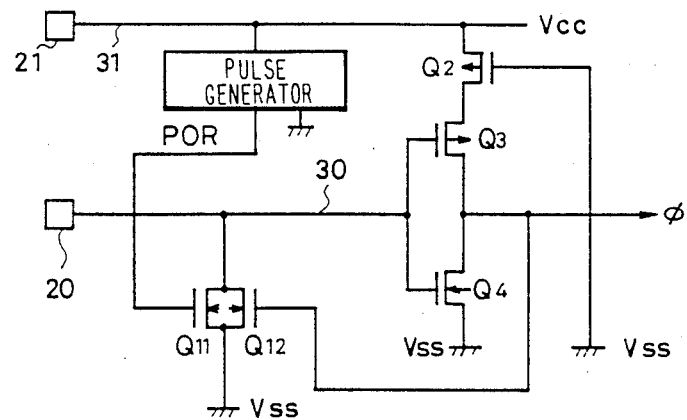
FIG. 4 is a diagram showing an example of a construction of a semiconductor integrated circuit device according to another embodiment of the present invention.

FIG. 4 is a diagram showing a construction of a function instructing signal generating circuit according to another embodiment of the invention. In the construction shown in FIG. 4, an output of an inverter formed by the transistors Q2 to Q4, that is, a control signal $\phi$ is applied to the gate of a transistor Q12 for setting and maintaining the potential on the input signal line 30. Also in this circuit construction, if the input threshold voltage of the inverter formed by the transistors Q2 to Q4 is set to a suitable value, the transistor Q12 can be turned off during charging of the input signal line 30 even in the state in which the pad 20 is connected to the power supply potential Vcc, and the transistors Q11 and Q12 are both turned off during the application of the power supply potential. Thus, the current path between the input signal line 30 and the ground potential Vss can be cut off and consumption of power can be reduced.

In the above described respective embodiments, the p channel MOS transistor Q2 is included in the inverter for providing the signal $\phi$. This transistor Q2 is provided for the purpose of setting the input threshold voltage of the inverter stage and therefore it is not particularly necessary to provide this transistor Q2.

Figure 5:
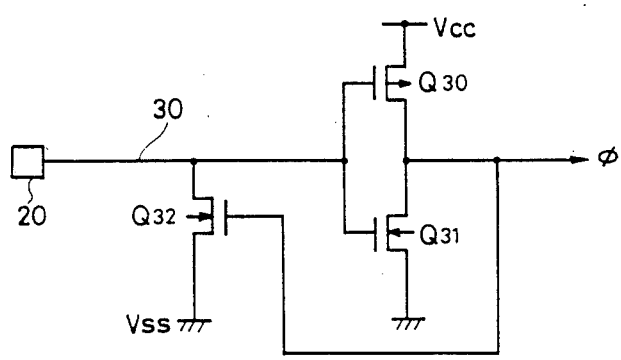
FIG. 5 is a diagram showing a construction of a semiconductor integrated circuit device according to a further embodiment of the present invention.

FIG. 5 is a diagram showing a construction of a function instructing signal generating circuit according to a further embodiment of the invention. In the construction shown in FIG. 5, a capability ratio (an on resistance ratio, a threshold voltage ratio and the like) of transistors Q30 and Q31 constituting an inverter for generating a function instructing signal $\phi$ is set to a suitable value, whereby the potential on the input signal line 30 during application of the power supply is set suitably. In this construction, if the transistor Q30 is turned on earlier than the transistor Q31 at the time of turn-on of the power supply for example (or if the transistor Q30 has a larger current supply capability), the signal $\phi$ instantaneously rises to H level to turn on the transistor Q32, whereby the input signal line 30 is reset to the ground potential Vss and the potential on the input signal line is fixed to L level. If the input signal line 30 is connected to the power supply potential Vcc through the pad 20, the signal $\phi$ is at H level and the transistor Q32 is in the on state until the potential of the charged input signal line 30 exceeds the input threshold voltage of the inverter formed by the transistors Q30 and Q31 at the time of turn-on of the power supply. If the potential of the input signal line 30 exceeds the threshold voltage of the inverter of the transistors Q30 and Q31, the signal $\phi$ falls to L level and the transistor Q32 is turned off. As a result, the current path between the input signal line 30 and the ground potential Vss is cut off and the cut-off state is maintained during supply of electric power. Although it is necessary to minimize the rush current at the time of turn-on of the power supply, there is a possibility that a current path may be formed while the transistor Q32 is brought into the on state. In this case, if the impedance of the transistor Q32 is enhanced, for example, by increasing the gate length thereof, the value of the rush current can be reduced. In addition, if the input threshold voltage of the inverter formed by the transistors Q30 and Q31 is set to a suitable value to minimize the time constant for charging the input signal line 30 and to minimize the time duration for the transistor Q32 to be in the on state, the rush current value at the time of turn-on of the power supply can be also reduced.

Although the above described respective embodiments are related with the case in which the function instructing signal $\phi$ is generated dependent on whether or not the input signal line 30 is connected to the power supply potential Vcc, the function instructing signal $\phi$ may be generated dependent on whether or not the input signal line 30 is connected to the ground potential Vss.

FIG. 6 is a diagram showing a construction of a function instructing signal generating circuit according to a fourth embodiment of the invention.

In the construction shown in FIG. 6, p channel MOS transistors Q40 and Q41 are provided in parallel with each other between the power supply line 31 and the input signal line 30. The p channel MOS transistor Q40 receives, at its gate, a signal $\overline{POR}$ from the pulse generating circuit 40. The p channel MOS transistor Q41 receives a function instructing signal $\overline{\phi}$ at its gate. In the construction shown in FIG. 6, the level of the function instructing signal $\overline{\phi}$ is set dependent on whether the pad 20 for function designation, connected to the input signal line 30, is connected to the ground terminal 25 or not. The pulse generating circuit 40 has the same construction as described previously with reference to FIGS. 1 to 4 and the signal $\overline{POR}$ of the inversion of the signal POR is used as a signal for resetting the input signal line 30. Next, operation of the circuit shown in FIG. 6 will be described with reference to an operation waveform diagram of FIG. 7.

When the power supply potential Vcc is applied to the power supply line 31 through the power supply pad 21, the control signal $\overline{POR}$ is supplied from the pulse generating circuit 40. The signal $\overline{POR}$ is a signal which rises with a delay of predetermined time after the turn-on of the power supply, in the same manner as described previously with reference to FIGS. 2 and 3. Accordingly, the transistor Q40 is in the on state until the signal $\overline{POR}$ rises after the turn-on of the power supply. Assuming that the pad 20 is not connected to the ground terminal 25, the input signal line 30 is charged up to the power supply potential Vcc through the transistor Q40 in the on state. When the signal potential level on the input signal line 30 exceeds the input threshold voltage of the inverter stage, the function instructing signal $\phi$ falls to L level. In response to the fall of the function instructing signal $\phi$ to L level, the transistor Q41 is turned on so that the power supply potential Vcc is continuously applied from the power supply line 31 to the input signal line 30 to maintain the potential on the input signal line 30 at the level of Vcc. On the other hand, when the signal $\overline{POR}$ from the pulse generating circuit 40 rises to H level, the transistor Q40 is turned off. Accordingly, when the pad 20 is in the open state, the potential on the input signal line 30 is maintained at H level equal to the Vcc level through the transistor Q41 during the supply of electric power.

Next, operation in the case of the pad 20 being connected to the ground terminal 25 will be described. In this case, when the power supply potential Vcc is applied to the power supply line 31, the input signal line 30 is charged through the transistor Q40 in the on state. On the other hand, since the pad 20 is connected to the ground terminal 25, the input signal line 30 is discharged to the level of the ground potential Vss through the ground terminal 25. When the signal $\overline{POR}$ from the pulse generating circuit 40 rises to H level, the transistor Q40 is turned off and the input signal line 30 is discharged to the ground potential Vss. When the potential on the input signal line 30 becomes smaller than the input threshold voltage of the inverter formed by the transistors Q2 to Q4, the signal $\phi$ outputted from the inverter stage rises to H level, whereby the transistor Q41 is turned off. In the construction shown in FIG. 6, the transistor 40 is in the on state during a period (several microseconds in practice) from the start of application of the power supply potential Vcc to the rise of the signal $\overline{POR}$, and accordingly a direct current path from the power supply line 31 to the ground potential terminal 25 exists to cause flow of direct current. However, if the impedance of the transistor Q40 is made to have as high a value as possible, the value of the current flowing through the path can be minimized.

Figure 8:
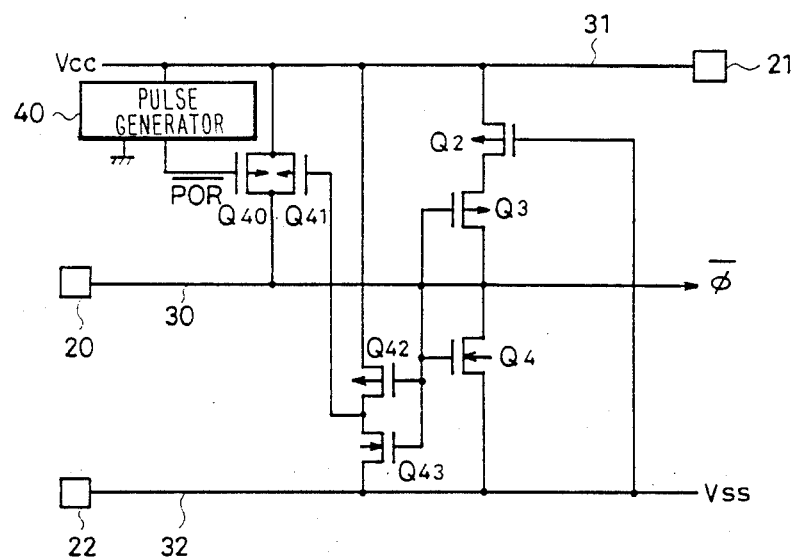
FIG. 8 is a diagram showing a construction of a semiconductor integrated circuit device according to a fifth embodiment of the invention.

FIG. 8 is a diagram showing a construction of a fifth embodiment of the invention, in which a CMOS inverter having its input gate connected to the input signal line 30 and its output gate connected to the gate of the MOS transistor Q41 is provided for control of operation of the p channel MOS transistor Q41. The CMOS inverter for control of operation of the transistor Q41 comprises a P channel MOS transistor Q42 and an n channel MOS transistor Q43 which are connected in a complementary manner. In this construction, the input threshold voltage of the inverter formed by the transistors Q42 and Q43 is set to a suitable value for fixing the potential on the input signal line 30 at the time of turn-on of the power supply. Also in the circuit construction shown in FIG. 8, the input signal line 30 is charged for a certain period by the function of the transistor Q40 and when the potential of the charged input signal line 30 exceeds the input threshold voltage of the inverter formed by the transistors Q42 and Q43, a signal of L level is applied to the gate of the transistor Q41. As a result, the transistor Q41 is turned on, so that the input signal line 30 is maintained at the power supply potential Vcc when the pad 20 is in the open state. If the pad 20 is connected to the level of the ground potential Vss, the transistors Q40 and Q41 are both turned off after the rise of the signal $\overline{POR}$ to H level after application of the power supply potential Vcc and accordingly if the input signal line 30 is connected to the ground potential Vss, a direct current path does not exists and no power is consumed.

Figure 9:
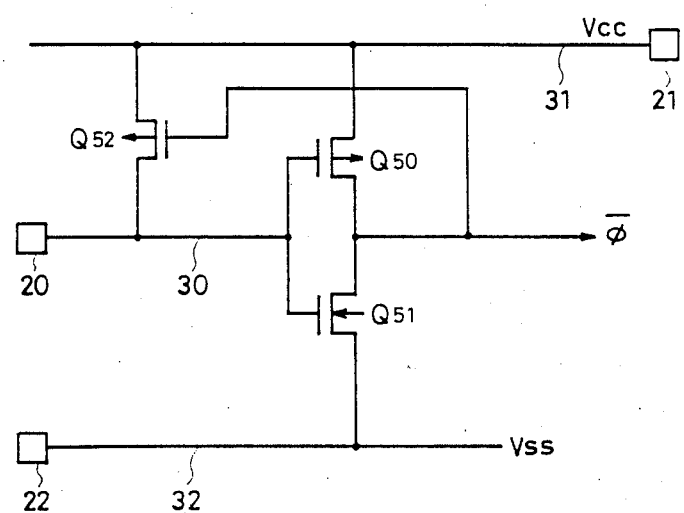
FIG. 9 is a diagram showing a construction of a semiconductor integrated circuit device according to a sixth embodiment of the invention.

FIG. 9 is a diagram showing a construction of a signal generating circuit according to a sixth embodiment of the invention. In the construction shown in FIG. 9, the control signal $\overline{\phi}$ is used to maintain the potential on the input signal line 30 and also used as an operation control signal for a p channel MOS transistor Q52 for cutting off a current path. The construction shown in FIG. 9 corresponds to the construction shown in FIG. 5. Thus, the initial potential on the input signal line 30 at the time of turn-on of the power supply is ensured by suitably adjusting a capability ratio of the transistors Q50 and 51 (namely, an on resistance ratio and a threshold voltage ratio, a current supply capability ratio etc.). In this construction of FIG. 9, if the capability of the transistor Q50 is, for example, smaller than that of the transistor Q51, and the transistor Q51 is turned on earlier than the transistor Q50 is, immediately after the turn-on of the power supply, the signal $\overline{\phi}$ falls to L level, and the transistor Q51 is in the on state immediately after the turn-on, to charge the input signal line 30 up to the level of the power supply potential Vcc. The signal $\overline{\phi}$ is set to L level by operation of the inverter formed by the transistors Q50 and Q51, so that the on state of the transistor Q52 is maintained. Thus, the potential on the input signal line 30 can be maintained at the fixed level of the power supply potential Vcc immediately after the turn-on of the power supply. If the pad 20 is connected to the ground potential Vss, although the transistor Q52 is brought into the on state for a very small time period, since the input signal line 30 is discharged to the ground potential Vss through the pad 20, the instructing signal $\overline{\phi}$ changes rapidly to H level to turn off the transistor Q52, whereby the current path is cut off. In this case, if the transistor Q52 is made to have a high impedance, it becomes possible to reduce the amount of the current flow flowing through the on state transistor Q52. In this case, if the input threshold voltage of the inverter formed by the transistors Q50 and Q51 is set to a suitable value, the transistor Q52 can be turned off during discharging of the input signal line 30, which makes it possible to minimize the rush current at the time of turn-on of the power supply. Also in the case of connecting the pad 20 to the ground potential Vss, the transistor Q2 included in the inverter for providing the signal $\bar{\phi}$ is provided to adjust the input threshold voltage of the inverter stage, however, it is not particularly necessary to provide the transistor Q2.

Figure 10:
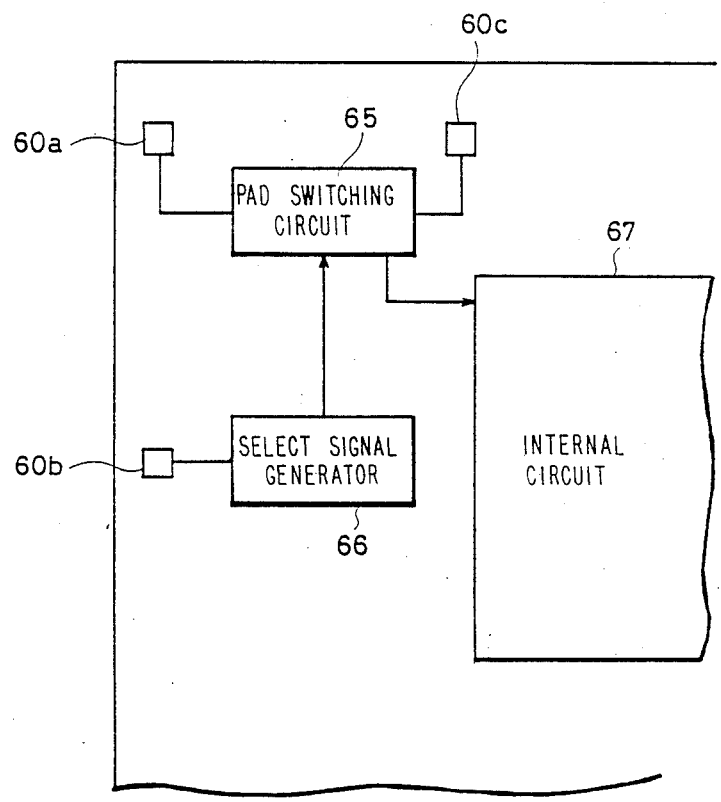
FIG. 10 is a diagram showing a construction of a still further application example of the invention.
Figure 11:
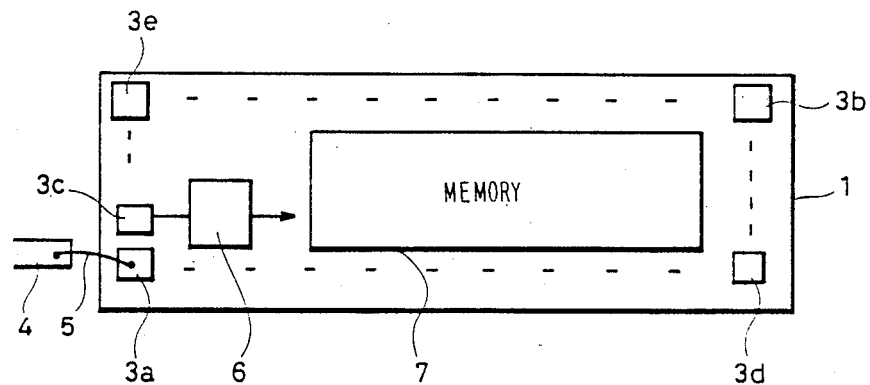
FIG. 11 is a schematic view showing a general construction of a conventional semiconductor integrated circuit device.
Figure 12:
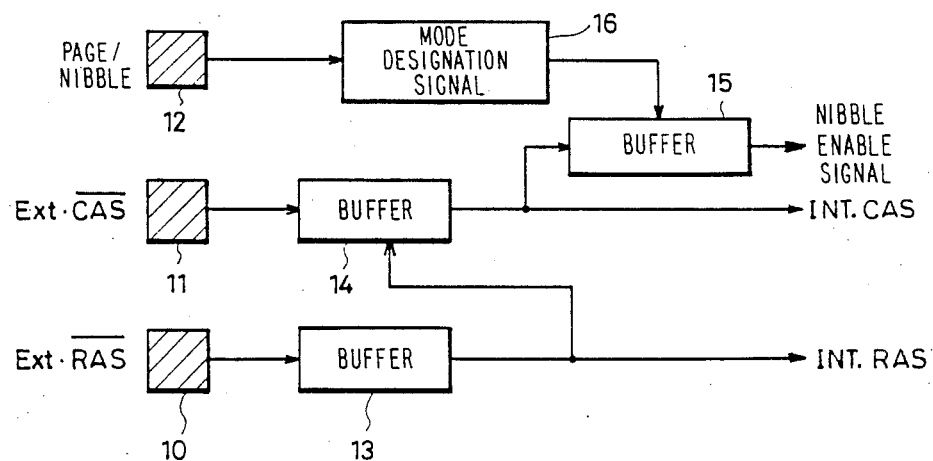
FIG. 12 is a diagram showing a specified example of a conventional semiconductor integrated circuit device.

Although the circuit construction for generating the function selecting signal in the semiconductor integrated circuit with the CMOS circuit configuration was described in the above described respective embodiments, the present invention is also applicable to other cases using the wire bonding selection system, in which, for example as shown in FIG. 10, selection of available pads is effected by the wire bonding selection technique to use bonding pads arranged matching with a form of a package. More specifically, the present invention is applicable to the construction as shown in FIG. 10, which comprises a selection signal generating circuit 66 for generating a pad designation signal and a pad switching circuit 65 for connecting either the pad 60a or the pad 60c to an internal circuit 67 in response to a signal from the selection signal generating circuit 66. A similar problem as in a conventional selection signal generating circuit will occur in the selection signal generating circuit 66 in the construction shown in FIG. 10, since a level of a signal generated from the selection signal generating circuit 66 is set dependent on the presence and absence of bonding to the bonding pad 60b, to connect either of the bonding pads 60a and 60c to the internal circuit 60 by means of the path switching circuit. However, if the present invention is applied to this construction, the same effect as in the above described embodiments can be obtained and it becomes possible to realize a semiconductor integrated circuit device comprising a selection signal generating circuit with low power consumption.

In addition, although selection of functions or switching of pads is effected in a semiconductor integrated circuit device such as a DRAM for example by using the wire bonding in the above described embodiments, it goes without saying that the present invention is also applicable to other cases such as a case in which switching of connection is effected by the master slicing technology to generate a function instructing signal of a predetermined level, or a case using the master slicing technique and the wire bonding selection technique in a mixed manner.

In addition, although an operation mode designation signal in a DRAM was described as an example in the above described embodiments, the present invention is not limited thereto. The present invention is applicable to other circuit construction insofar as it enables an internal function designation signal to be generated dependent on a potential on an input signal line. Further, the present invention is also applicable to a construction for selecting DC characteristics of a device, for example, for switching between a device of ultra-low standby current and a device of normal standby current by connection of bonding pads.

In addition, although the specified circuit construction including means for cutting off a current path in the case of connecting the input signal line to the power supply potential or the ground potential was described in the above described embodiments in connection with the drawings, the present invention is not limited thereto and, needless to say, any circuit construction may be used insofar as it permits cut-off of a current path through an input signal line in response to turn-on of a power supply.

As described in the foregoing, according to the present invention, if the input signal line (the signal line for inputting the function designation signal) is connected to the power supply potential or the ground potential in the internal function instructing signal generating circuit in the semiconductor integrated circuit, a construction for cutting off the current path formed through the input signal line in response to turn-on of the power supply is used to cut off a direct current component even if the input signal line is connected to a predetermined potential. Thus, a semiconductor integrated circuit having ultra-low standby current characteristics can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having operational functions, selection of a particular function being determined by the absence or presence of a wiring connection between a first bonding pad (20) and a power supply having a first predetermined potential, comprising:

a first potential supply line (31) for supplying an operating potential (Vcc), means (Q2, Q3, Q4) for generating a signal for designating one of said operational functions in response to a potential on an input signal line (30) connected to said first bonding pad (20), means (40) for generating aone shot pulse signal for a predetermined period in response to energizing of said first potential supply line by said power supply, means (Q11, Q40, Q52) momentarily activated in response to an output of said one shot pulse signal generating means, for resetting said input signal line to a second predetermined potential, and means (Q12, Q13, Q14; Q3, Q4, Q12; Q30, Q31, Q32; Q3, Q4, Q41; Q41, Q42, Q43; Q50, Q51, Q52) for setting and maintaining a potential on said input signal line in response to said potential on said input signal line, and cutting off a current path formed by said input signal line, said first bonding pad and said power supply when said bonding pad is connected to said power supply.

2. The semiconductor integrated circuit device of claim 1, wherein said first bonding pad is coupled to said input signal line to designate one of the operational functions of said semiconductor integrated circuit device dependent on connection of said first bonding pad to said power supply, and said resetting means (Q11) is circuit means which is provided between said input signal line and a second source of potential different from said power supply and is enabled in response to the output of said one shot pulse signal generating means, to reset said input signal line to the potential of said second source when said first bonding pad is not connected to said power supply.

3. The semiconductor integrated circuit device of claim 2, wherein
said circuit means is a switching transistor of high impedance.

4. The semiconductor integrated circuit device of claim 2, wherein
said maintaining and cutting-off means comprises:
inverter means (Q13, Q14) provided between said power supply and said second source of potential, for inverting the potential on said input signal line and outputting the inverted potential, and
a switching transistor (Q12) provided between said input signal line and said second source of potential, to be in a non-conductive state in response to the output of said inverter means.

5. The semiconductor integrated circuit device of claim 2, wherein
said maintaining and cutting-off means comprises a switching transistor (Q12) provided between said input signal line and said second source of potential, on/off operation of said switching transistor being controlled in response to an output of said function designation signal generating means.

6. The semiconductor integrated circuit device of claim 2, wherein
said resetting means and said maintaining and cutting-off means comprise a switching transistor (Q32) in common, which is provided between said input signal line and said second source of potential, and the operation of which is controlled in response to outputs to said function designation signal generating means (Q30, Q31).

7. The semiconductor integrated circuit device of claim 1, wherein
said first bonding pad is coupled to said input signal line to designate one of the operational functions of said circuit device dependent on connection of said first bonding pad to a second source of potential different from said power supply, and
said resetting means comprises circuit means (Q40) provided between said first potential supply line and said input signal line, and controlled in response to the output of said activation signal generating means, to reset said input signal line to said operation power supply potential when said input signal line is not connected to said second source of potential.

8. The semiconductor integrated circuit device of claim 7, wherein
said maintaining and cutting-off means comprises a switching transistor (Q41) provided between said input signal line and said first potential supply line, to be turned off in response to an output of said function designation signal generating means.

9. The semiconductor integrated circuit device of claim 7, wherein
said maintaining and cutting-off means comprises:
inverter means (Q42, Q43) provided between said first potential supply line and said second source of potential, for inverting the potential on said input signal line and outputting the inverted potential, and
a switching transistor (Q41) provided between said first potential supply line and said input signal line, on/off operation of said switching transistor being controlled in response to the output of said inverter means.

10. The semiconductor integrated circuit device of claim 7, wherein
said resetting means and said maintaining and cutting-off means comprises a switching transistor (Q52) in common, which is provided between said first potential supply line and said input signal line, on/off operation of said switching transistor being controlled in response to an output of said function designation signal generating means (Q50, Q51).

11. The semiconductor integrated circuit device of claim 1, wherein
said one shot pulse signal generating means comprises means (Q20, C) for slowing the rise of potential on said first potential supply line (31).

12. The semiconductor integrated circuit device of claim 11, wherein
said slowing means comprises RC delay means including resistance means (Q20) and capacitance means (C).

13. The semiconductor integrated circuit device of claim 11, wherein
said activation signal generating means comprises inverter means (I1 to I3) for receiving an output of said slowing means.

14. A system for determining operational functions for a semiconductor integrated circuit device using selection between at least first and second bonding pads (60a, 60c) to set a proper connection to an external circuit (67), comprising:
a selection signal generator (66);
a pad switching circuit (65) for selecting between said bonding pads in response to an output of said selection signal generator (66);
a second potential bus;
a selection binding pad (60b) connectable to either a power supply providing a first potential or said second potential bus, and further connectable to said selection signal generator in a manner to determine the specific output of said selection signal generator so as to select a specific bonding pad for connection from among at least said first and second bonding pads;
said selection signal generator comprising
a first potential supply line connected to a power supply providing a first potential;
an input signal line connectable to said bonding pad for selection;
means for generating at least two types of output signals for determining a bonding pad for connection to be selected by said pad switching circuit in response to a potential on said input signal line;
means for generating an activation signal for a predetermined period in response to application of said first potential to said first potential supply line;
means activated in response to an output of said activation signal generating means, for resetting said input signal line to a predetermined potential; and
means for setting and maintaining the potential on said input signal line in response to said potential on said input signal line, and cutting off a current path formed by said input signal line, said selection bonding and either said power supply or said second potential bus.

* * * * *

UNITED STATES PATENT AND TRADEMARK OFFICE
CERTIFICATE OF CORRECTION

PATENT NO. : 4,985,641

DATED : January 15, 1991

INVENTOR(S) : Yasuji Nagayama, et al.

It is certified that error appears in the above-identified patent and that said Letters Patent is hereby corrected as shown below:

ON THE TITLE PAGE:
Please correct item [75], second inventor's name to read as follows:

Change "Hirayama Kazutoshi" to --Kazutoshi Hirayama--.

Signed and Sealed this

Thirtieth Day of June, 1992

*Attest:*

DOUGLAS B. COMER

*Attesting Officer*       *Acting Commissioner of Patents and Trademarks*